(12) United States Patent
Takigawa et al.

(10) Patent No.: US 6,338,903 B1
(45) Date of Patent: Jan. 15, 2002

(54) RESIN COMPOSITION FOR SEMICONDUCTOR ENCAPSULATION, METHOD AND APPARATUS FOR PRODUCING THE COMPOSITION, AS WELL AS SEMICONDUCTOR DEVICE USING THE COMPOSITION

(75) Inventors: Yukio Takigawa; Ei Yano, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/605,545

(22) Filed: Jun. 29, 2000

Related U.S. Application Data

(63) Continuation of application No. PCT/JP99/06118, filed on Nov. 2, 1999.

(30) Foreign Application Priority Data

Nov. 2, 1998 (JP) ............................................. 10-312300

(51) Int. Cl.$^7$ ..................... B32B 27/38; M01L 29/12; B03C 1/00; B29C 47/88; B05D 5/12
(52) U.S. Cl. ................. 428/413; 428/620; 209/217; 209/219; 209/228; 425/215; 264/211.12; 427/96
(58) Field of Search ................. 209/212, 213, 209/214, 215, 216, 217, 218, 219, 220, 221, 222, 223, 224, 225, 226, 227, 228, 229, 230; 523/181; 428/413, 620; 427/96; 425/215; 264/211.12

(56) References Cited

U.S. PATENT DOCUMENTS

| | | | | |
|---|---|---|---|---|
| 5,258,222 A | * | 11/1993 | Crivelli | 428/323 |
| 5,636,748 A | * | 6/1997 | Arvidson | 209/223.2 |
| 6,054,222 A | * | 4/2000 | Takami et al. | 428/417 |

FOREIGN PATENT DOCUMENTS

| | | |
|---|---|---|
| JP | 5-343570 | 12/1993 |
| JP | 7-163903 | 6/1995 |
| JP | 3044299 | 10/1997 |

* cited by examiner

*Primary Examiner*—Robert Dawson
*Assistant Examiner*—Michael J Feely
(74) *Attorney, Agent, or Firm*—Armstrong, Westerman, Hattori, McLeland & Naughton, LLP

(57) ABSTRACT

A semiconductor encapsulating resin composition which is powdery particles of a resin composition comprising an epoxy resin, a curing agent and an inorganic filler, and produced through a series of unit operations inclusive of melt-kneading and pulverization of a raw material mixture, wherein foreign metal having magnetic property originating from metal materials constituting production apparatuses used in the unit operations and contained in the powdery particles are selectively recovered and removed by a drum type metal classification-recovering apparatus. This semiconductor encapsulating resin composition provides a high reliability semiconductor device not containing magnetic foreign metal.

10 Claims, 6 Drawing Sheets

RESIN COMPOSITION FOR SEMICONDUCTOR ENCAPSULATION, METHOD AND APPARATUS FOR PRODUCING THE COMPOSITION, AS WELL AS SEMICONDUCTOR DEVICE USING THE COMPOSITION

CROSS-REFERENCE TO RELATED APPLICATIONS

This application is based upon and claims priority of Japanese Patent Application No. 10-312300, filed Nov. 2, 1998, the contents being incorporated herein by reference, and a continuation of PCT/JP99/06118 filed Nov. 2, 1999.

TECHNICAL FIELD

This invention relates to a resin composition for semiconductor encapsulation not containing metal powder coated with a resin, ultra-fine metal powder, metal powder having low magnetism, etc, and a method and apparatus for producing such a resin composition. The present invention relates also to a resin-sealed semiconductor device using such a resin composition.

BACKGROUND ART

Conventional semiconductor devices are fabricated by packaging a semiconductor device onto a lead frame as a substrate and molding other portions with a resin, as is well known in the art. Recent down-sizing electronic appliances has created a demand for a reduction in the size and thickness, and higher performance of, semiconductor devices. Miniaturization of semiconductor devices, for example, has been mainly promoted by improvements in lead frames and molding resins. In line with this trend, a TSOP (Thin Small Outline Package) having a reduced thickness and QFP (Quad Flat Package) to cope with a multi-pin structure have been developed. A ball grid array (BGA) type package and a chip size package (CSP) have been developed to cope with the problems that the package size becomes greater with the increase of the number of pins and handling of package becomes more difficult as the pitch of external leads becomes smaller.

A resin composition, containing an epoxy resin as a main agent and inorganic fillers such as molten silica, has been generally used as a molding resin in the fabrication of the semiconductor devices described above. Such a resin composition is generally produced in the form of powder and particles through a series of unit operations of melt-kneading, pulverization, etc, of the mixture of starting materials such as epoxy resin, a curing agent, an inorganic filler, and so forth. More concretely, the resin composition in the powdery particle form is produced in the following way. The selected starting materials are mixed and the resulting mixture is molten, kneaded and cooled by metallic apparatuses such as a roll, an extruder, a kneader, etc. The mixture is thereafter pulverized by a pulverizing mill, a grinding mill, and so forth. When the powdery particles are produced through such a series of unit operations, however, the problem develops in that conductive metal powder originating from the metal material of the production apparatuses used mixes into the powdery particles.

Even though the mixing amount may be small, the conductive metal powder contained in the sealing resin composition can exert great influences on performance of the resulting semiconductor device. Chip size packages (CSP), for example, are produced by forming Cu bumps for external terminals by plating on a semiconductor wafer, applying resin molding by using a molding resin composition, forming solder balls on the Cu bumps and dicing the resulting processed semiconductor wafer into discrete semiconductor devices. In the resulting package, very fine wires having a wiring width/wiring gap =10 $\mu$m/10 $\mu$m are applied to the semiconductor wafer, and the thickness of the resin composition layer for molding the spaces between the wires is about 80 to about 120 $\mu$m. If any limited voids are contained in the resin composition layer, reliability of the semiconductor devices drops. Moreover, when a conductive metal powder exists in the mixture, the wires are short-circuited and this invites breakage of the device. In the case of a QFP, the gap of wire bonding tends to become smaller with the increase of the number of I/O pins. Therefore, the presence of the conductive metal powder contained in the sealing resin composition, if any, results in a remarkable drop in the reliability of the semiconductor devices.

In the CSP described above and in the QFP having wire bonding of a small pitch, and furthermore, in resin molded semiconductor devices using so-called "lead frame" or "TAB tape", a semiconductor molding resin composition not containing conductive metal powder has therefore been desired to further improve device reliability.

When conductive metal powder is contained in the molding resin composition used for the fabrication of the semiconductor devices, it is a customary practice to insert a magnetic rod into the powder of the resin composition produced, and to stir the powder to remove the metallic powder. Though this method is effective for removing a metal powder having a relatively large size and a ferromagnetic metal powder, it is not sufficient to remove the metal powder having a relatively small particle size or the magnetic powder having relatively low magnetism. It has therefore been desired to efficiently separate and remove not only the metal powder having a large particle size and the ferromagnetic metal powder but also the metal powder having a smaller particle size and the metal powder having low magnetism.

Japanese Unexamined Patent Publication (Kokai) No. 9-173890 discloses a drum type metal classification-recovering apparatus for separating and recovering any foreign metal having magnetic property (iron dust, iron powder, etc) contained as a mixture in the powder of a resin pellet, or the like, although the technology of this reference is not directed particularly to remove the metal powder from the molding resin composition used for the fabrication of the semiconductor devices. The "Prior Art" of this Japanese Unexamined Patent Publication (Kokai) No. 9-173890 illustrates a drum type metal classification-recovering apparatus 60 shown in FIG. 1. Reference numeral 61 in FIG. 1 denotes a case, and a cylindrical non-magnetic drum 63 having a built-in semi-circular cylindrical magnetic drum 62 is turnably disposed inside the case 61. Two scrapers 71 are fitted at symmetrical positions on the surface of the non-magnetic drum 63. A hopper 64 for receiving a raw material 65 to be processed, a guide plate 66 for guiding the raw material 65 and a damper 67 for continuously supplying a suitable amount of the raw material 65 to the magnetic drum 62 are provided above the case. A partition member 72 is disposed at the lower part of the case, and a raw material discharge port 69 and a discharge port 73 for foreign metal are provided on both sides of the partition member 72.

FIG. 2 shows a magnetic circuit construction of the non-magnetic drum 63 shown in FIG. 1. A substantially semi-circular magnetic member 74 is fixed to a shaft 78 through an arm 77. Permanent magnets 75 are magnetized in a thickness-wise direction so that the portion thereof on the side of the non-magnetic drum 63 constitutes the N pole. Permanent magnets 76 are magnetized in the thickness-wise direction so that the portion thereof on the side of the non-magnetic drum 63 constitutes the S pole. These permanent magnets 75 and 76 are arranged alternately and equidistantly on the outer peripheral surface of the magnetic member 74 that is made of a steel. Thus, both permanent magnets 75 and 76 constitute a magnetic circuit through the magnetic member 74. In other words, both permanent magnets 75 and 76 constitute a magnetic circuit in which the magnetic flux a flowing out from the N poles of the permanent magnet 75 generates the magnetic field on the surface of the non-magnetic drum 63, permeates through the foreign metal 70 having a magnetic property, magnetically attracts the foreign metal 70 and returns to the S pole of the permanent magnet 76.

In the drum type metal classification-recovering apparatus 60, the main raw material 68, as non-magnetic material inside the raw material 65 that is charged from the hopper 64, is not affected by the magnetic force generated from the magnetic drum 62. Therefore, the raw material 68 falls freely due to its own weight, and is discharged from the raw material discharge port 69. On the other hand, the foreign metal 70 having magnetic property contained as mixture in the raw material 65 are affected by the magnetic force generated from the magnetic drum 62 and are attracted to the surface of the non-magnetic drum 63. When the non-magnetic drum 63 is rotated counter-clockwise RD, the foreign metal 70 is carried into the lower part of the case 61 by the scrapers 71 while they are kept attracted to the surface of the non-magnetic drum 63. After being conveyed to the right-hand region of the partition member 72 in the drawing, the foreign metal 70 is released from the influences of the magnetic force generated from the magnetic drum 62, fall from the surface of the non-magnetic drum 63, is discharged from the discharge port 73 for the foreign metal, and is thus separated from the main raw material 68 and recovered.

As described above, the drum type metal classification-recovering apparatus 60 according to the prior art selects and recovers the main raw material 68 by attracting the foreign metal 70, that is mixed in the raw material 65, by the magnetic force of the magnetic drum 62, and transfer them by the scrapers 71. The drum type metal classification-recovering apparatus of this kind has the magnetic circuit construction shown in FIG. 2. Since the intensity of the magnetic force generated from the magnetic drum 62 is limited, however, classification-recovery efficiency drops remarkably when the magnetic foreign metal is very small particles.

The drum type metal selection-recovery apparatus described in Japanese Unexamined Patent Publication (Kokai) No. 9-173890 solves the problem of the drop of classification-recovering efficiency described above. As shown in FIG. 3, this improved drum type metal classification-recovering apparatus is the same in the basic construction as the drum type metal classification-recovering apparatus shown in FIGS. 1 and 2. However, an improvement can be made in the magnetic drum. In the drum type metal classification-recovering apparatus, a part of which is shown in FIG. 3, a magnetic member shaped into a substantially semi-circular cylindrical shape has the outer peripheral portion that is shaped into a substantially gear-like tooth-shaped sectional shape. In other words, recesses 74a and projections 74b are alternately formed in the circumferential direction. First magnets 79 and 79', the direction of magnetization of which is substantially the same as the tangential direction of the magnetic drum 62 (magnetized in the width-wise direction of the magnet) are disposed in the recesses 74a of the magnetic member 74. Second magnets 80 and 80', the direction of magnetization of which is substantially the same as the direction normal to the magnetic drum 62 (magnetized in the thickness-wise direction of the magnet) are disposed at the projections 74b of the magnetic member 74.

The first magnets 79 and 79' adjacent to each other are disposed so that the magnetic poles having the same polarity oppose each other. In other words, one of the first magnets 79 has the N pole on the side of the second magnet 80, and the other first magnet 79', too, has the N pole on the side of the second magnet 80.

Furthermore, the second magnets 80 and 80' are disposed in such a fashion that the magnetic poles on the side closer to the non-magnetic drum 63 have the same polarity as the magnetic poles of the contact surface of the first magnets. In other words, since the magnetic poles of the contact surfaces of the first magnets 79 and 79' adjacent to each other are S poles, the magnetic pole of the second magnet 80' on the side of the non-magnetic drum 63 is an S pole.

In the drum type metal classification-recovering apparatus of FIG. 3, due to the specific structure of the magnetic drum as shown in the drawing, the second magnets 80 and 80' constitute the magnetic circuit by using the projections of the magnetic member 74 (whereby the line of the magnetic flux passes through the projections). Therefore, the effective magnetic path length becomes great, hence the magnet operating point becomes high. In addition, the repulsive force functions between the second magnets 80, 80' and the first magnets 79, 79'. Consequently, this apparatus can provide a high magnetic force in cooperation with the improvement of the magnet operating point.

FIG. 5 shows a flux density distribution in the circumferential direction on the outer peripheral surface of the non-magnetic drum 63 of the magnetic drum 62 shown in FIG. 3. FIG. 4 shows a flux density distribution in the circumferential direction on the outer peripheral surface of the non-magnetic drum 63 of the magnetic drum 62 shown in FIGS. 1 and 2. To insure the correctness of the comparison, the material, the size, etc, of the magnetic drums of the metal classification-recovering apparatuses are assumed to be common. When the flux density distribution of FIG. 5 is compared with that of FIG. 4 as the prior art, the flux density of FIG. 4 is 285 mT whereas the flux density of FIG. 5 is 433 mT. It can be appreciated that the magnetic drum of FIG. 5 has a high magnetic force about 1.5 times higher than that of the prior art. Therefore, when the drum type metal classification-recovering apparatus of FIG. 3 is employed, it can be expected that magnetic foreign metal, having very fine shapes, mixed in the raw material can be classified and recovered.

However, even in the improved drum type metal classification-recovering apparatus described above, however, the resulting magnetic force is still low. Therefore, this apparatus is not yet sufficient for selectively removing magnetic powder such as metal power coated with a resin, ultra-fine metal powder, metal powder having low magnetism, and so forth, from the molding resin composition used for the fabrication of the semiconductor devices. As a matter of fact, the classification-recovering ratio of the apparatus shown in FIGS. 1 and 2 drops remarkably with the decreasing particle sizes of the magnetic foreign metal because the intensity of the magnetic force generated from the magnetic drum has a limit. In the apparatus shown in FIG. 3, there is a distance between the magnetic drum and the surface of the non-magnetic drum for attracting the magnetic foreign metal. Therefore, the magnetic force generated by the permanent magnets disposed on the magnetic drum does not appear as such on the surface of the non-magnetic drum. Consequently, this apparatus is not suitable for classifying and recovering ultra-fine metal power having sizes (length, diameter, etc) of less than 35 µm, metal powder covered with resin and other metal powders having low magnetism.

DISCLOSURE OF THE INVENTION

It is an object of the present invention to provide an encapsulation resin composition that can solve the problems of the prior art technologies described above, is used particularly for the production of semiconductor devices, and does not contain ultra-fine metal powder having a size of less than 35 µm, metal powder coated with a resin and other metal powder having low magnetism (all of which will be referred thereinafter to "magnetic foreign metal"), in addition to metal powder that can be removed ordinarily by the prior art technologies (hereinafter referred to "ordinary metal powder").

It is another object of the present invention to provide a method and apparatus useful for producing the encapsulation resin composition of the present invention and a semiconductor device using the encapsulation resin composition, as will be understood from the following detailed description of the invention.

The above and other objects of the present invention will be understood more fully from the following detailed explanation.

According to one aspect of the present invention, there is provided a semiconductor encapsulating resin composition comprising an epoxy resin, a curing agent and an inorganic filler, wherein the resin composition is powdery particles produced by a series of unit operations including melt-kneading and pulverization of a starting raw material mixture, and wherein foreign metal having magnetic property originating from metal materials constituting a production apparatus used during the unit operations and mixed into the powdery particles is selectively recovered and removed by a drum type metal classification-recovering apparatus.

According to another aspect of the present invention, there is provided a method of producing a semiconductor encapsulating resin composition comprising an epoxy resin, a curing agent and an inorganic filler, comprising processing a raw material mixture of the molding resin composition into powdery particles through a series of unit operations including melt-kneading and pulverization of the raw material mixture; charging the resulting powdery particles into a drum type metal classification-recovering apparatus, and selectively recovering and removing the magnetic foreign metal originating from metal materials constituting a production apparatus used and mixed into the powdery particles.

According to still another aspect of the present invention, there is provided an apparatus for producing a semiconductor encapsulating resin composition comprising an epoxy resin, a curing agent and an inorganic filler, comprising an apparatus for melting and kneading a raw material mixture of the molding resin composition; an apparatus for pulverizing the resulting kneaded matter and forming powdery particles of the molding resin composition; and a drum type metal classification-recovering apparatus for selectively recovering and removing the magnetic foreign metal originating from metal materials constituting an apparatus used for producing the powdery particles of the resin composition, inclusive of the melt-kneading means and the pulverizing means.

According to still another aspect of the present invention, there is provided a resin-sealed semiconductor device produced by encapsulating a semiconductor substrate having bumps for external terminals with a semiconductor encapsulating resin composition while the end face of the bumps are exposed, followed by dicing the semiconductor substrate into discrete devices; wherein the semiconductor encapsulating resin composition is the semiconductor encapsulating resin composition comprising an epoxy resin, a curing agent and an inorganic filler according to the present invention.

BEST MODE FOR CARRYING OUT THE INVENTION

Figure 1:
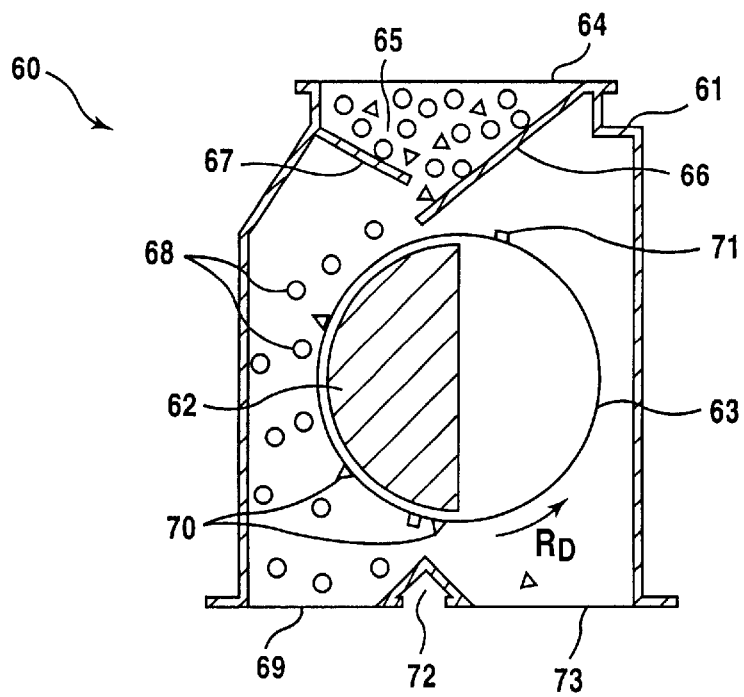
FIG. 1 is a sectional view showing the outline of a drum type metal classification-recovering apparatus according to the prior art.

A semiconductor encapsulation resin composition according to the present invention comprises, at least, an epoxy resin (A), a curing agent (B) and an inorganic filler (C), and has a powdery particle form. The powdery particles of such a resin composition can be produced generally by conducting a series of unit operations including melting, kneading and pulverization, for the raw material components including the epoxy resin, the curing agent, a curing catalyst, the inorganic filler, and so forth.

The epoxy resin (A) used as the main agent in the encapsulation resin composition of the present invention is not particularly limited. However, the epoxy resin preferably contains at least two epoxy groups in one molecule. Suitable examples of the epoxy resin (A) include various novolak type epoxy resins, linear aliphatic epoxy resins, alicyclic epoxy resins, heterocyclic epoxy resins and halogenated epoxy resins that are synthesized from cresol novolak type epoxy resins, phenol novolak type epoxy resins, biphenyl type epoxy resins, naphthalene type epoxy resins, bis-phenol A, resorcin, and so forth. These epoxy resins may be used alone, or two or more epoxy resins may be combined in an arbitrary combination depending on the resin composition of the present invention and on the application of the semiconductor device using the resin composition. In the practice of the present invention, it is preferred to use an epoxy resin containing at least 50 wt % of the biphenyl type epoxy resin in the total epoxy resin from both aspects of heat resistance and moisture resistance.

The content of the epoxy resin (A) in the encapsulation resin composition according to the present invention is generally preferred to be within the range of 8 to 40 wt %. If the epoxy resin content is less than 8 wt %, the effect of addition, inclusive of the encapsulation effect, cannot be obtained satisfactorily. If the content exceeds 40 wt %, on the contrary, the remarkable increase of the addition effect cannot be expected.

The curing agent (B) is generally blended with the encapsulating resin composition according to the present invention. The curing agent (B) is not particularly limited so long as it can react with the epoxy resin (A) and can induce curing of the epoxy resin (A). Examples of suitable curing agent (B) include various novolak resins synthesized from phenol novolak resin, phenol aralkyl resins, tris-hydroxyphenylmethane, bisphenol A and resorcin, polyhydlic phenol compounds such as polyallylphenol, cyclopentadienephenol, resol resins and polyvinylphenol, acid anhydrides such as maleic anhydrides, phthalic anhydrides and pyromellitic anhydride, and aromatic amines such as methaphenylene diamine, diaminodiphenylmethane and diaminodiphenylsulfone. Among them, the phenol compound having at least two hydroxy groups in one molecule is useful as the curing agent (B) from the aspect of adhesion of the resulting cured product of the epoxy resin. Preferred examples are the phenolnovolak resin and the phenolaralkyl resin.

In the practice of the present invention, the blend ratio of the epoxy resin (A) and the curing agent (B) is not limited to the particular one, however, from the aspects of the mechanical properties and adhesion of the resulting cured product of the epoxy resin and the semiconductor device, the stoichiometric ratio of the curing agent (B) to the epoxy resin is preferably within the range of 0.5 to 1.5 and more preferably, 0.8 to 1.2. The content of the curing agent (B) in the encapsulating resin composition of the present invention can be varied over a broad range, but is preferably within the range of 8 to 40 wt %.

In the encapsulating resin composition according to the present invention, a curing catalyst for promoting the curing reaction between the epoxy resin (A) and the curing agent (B) may be contained, whenever necessary. The curing catalyst used hereby is not limited to the particular one, so long as it can promote the curing reaction. Examples of such a curing catalyst include imidazole compounds such as 2-methylimidazole, 2,4-dimethylimidazole, 2-methyl-4-methylimidazole and 2-heptadecylimidazole; tertiary amine compounds such as triethylamine, benzyldimethylamine, α-methylbenzylamine, 2-(dimethylaminomethyl)phenol, 2,4,6-tris(dimethyaminomethyl)phenol, and 1,8-diazabicyclo(5,4,0)undecene-7,1,5-diazabicyclo(4,3,0) nonene-5; organometallic compounds such as zirconium tetramethoxide, zirconium tetrapropoxide, tetrakis (acetylacetonato)zirconium and tri(acetylacetonato) aluminum; and organophosphine compounds such as triphenylphosphine, trimethylphosphine, triethylphosphine, tributylphosphine, tri(p-methylphenyl)phosphine, tri(nonylphenyl)phosphine, triphenylphosphine-triphenyboran and tetraphenylphosphonium-tetraphenyl borate. Preferred among them particularly are triphenylphosphine, tetraphenylphosphonium-tetraphenyl borate and 1,8-diazabicyclo(5,4,0)undecene-7 from the aspect of the excellent catalytic function to the curing reaction. These curing catalysts are generally used alone, but two or more kinds of the catalysts may be used in combination, if desired, depending on the application. The addition amount of the curing catalyst is generally preferred to be within the range of 0.1 to 10 parts by weight per 100 parts by weight of the epoxy resin (A).

The inorganic filler (C) is generally incorporated in the encapsulating resin composition of the present invention. Though not restrictive, amorphous silica, crystalline silica, calcium carbonate, magnesium carbonate, alumina, magnesia, clay, talc, calcium silicate, titanium oxide, antimony oxide, asbestos and glass fibers are examples of suitable inorganic filler (C). Amorphous silica among these inorganic fillers can be used advantageously because it has a great effect of lowering the coefficient of linear expansion and is effective for lowering the stress. Example of the amorphous silica is melt-silica obtained by melting quartz and synthetic silica produced by various synthesizing methods. Incidentally, these inorganic fillers may be used in various forms, such as a broken flake shape or a spherical shape.

The inorganic filler (C) is preferably subjected in advance to surface treatment by a silane type coupling agent that is hydrolyzed, and preferably has a coating of the silane type coupling agent on the surface thereof. When the silane coupling agent is hydrolyzed for this purpose, a mixing ratio of the silane coupling agent to pure water is preferably adjusted to a weight ratio of the coupling agent to pure water of 95:5 to 60:40. The hydrolyzing reaction cannot be completed if the mixing ratio of pure water is below 95:5, and pure water remains in excess and may deteriorate the properties of the encapsulating resin composition if the mixing ratio of pure water is above 60:40.

In another preferred embodiment of the present invention, the silane coupling agent is mixed in advance with the raw resin components, and the inorganic filler is then added to this resin mixture, instead of using the inorganic filler that is surface-treated with the silane coupling agent.

The silane coupling agent used for the surface treatment described above has preferably the structure in which hydrocarbon groups coupled with functional groups such as an alkoxy group, an epoxy group, an amino group, a mercapto group, etc, are coupled with the silicon atoms. To obtain chemical stability, in particular, the silane coupling agent having the epoxy group is preferably used. The addition amount of the silane coupling agent is preferably within the range of 0.2 to 5 parts by weight on the basis of 100 parts by weight of the filler. If the addition amount of the silane coupling agent is less than 0.2 parts by weight, the effect of addition does not appear, and if it exceeds 5 parts by weight, the moisture resistance drops.

Note when the present invention is executed, the coupling agent may be directly used instead of conducting the hydrolysis treatment. In such a case, silica having the hydroxyl group (–OH) on the surface thereof is preferably used.

The blend amount of the inorganic filler (C) in the encapsulating resin composition according to the present invention is not particularly limited. However, it is preferably within the range of 10 to 90 wt % of the total amount of the encapsulating resin composition. If the blend amount of the inorganic filler is less than 10 wt %, the effect of addition does not appear, and if it exceeds 90 wt %, on the contrary, the elastic modulus increases. In consequence, warping after encapsulation develops, and the stress occurring between the packaging substrate and the package due to the temperature after packaging cannot be absorbed with the result that cracking occurs in the solder bumps at the connection portions, and the moldability is deteriorated. The blend amount that falls within the range described above is also effective for satisfying the conditions of the bending elastic modulus of the resulting cured product at room temperature of at least 6 GPa and not higher than 19 GPa, and the coefficient of linear expansion from the room temperature to the glass transition temperature of from $6\times10^{-6}$ to $60\times10^{-6}$/K.

The encapsulating resin composition according to the present invention may contain, whenever desired, elastomers such as silicone rubber, olefinic copolymers, modified nitrile rubber, modified polybutadiene rubber, modified silicone rubber, etc, and a thermoplastic resin such as polyethylene, as a stress reducing agent. These stress reducing agents are preferably used particularly when the resulting cured product is required to satisfy the bending elastic modulus of 6 to 19 GPa at room temperature.

The encapsulating resin composition according to the present invention may further contain flame retarders such as halogen compounds, for example, halogenated epoxy resins, and phosphorus compounds, auxiliary flame-retarders such as antimony trioxide, coloring agents such as carbon black and cross-linking agents such as organic peroxides.

The semiconductor encapsulation resin composition according to the present invention can be produced using the raw components described above through a series of unit operations such as mixing, melt-kneading, cooling and pulverizing. The resulting resin composition has the form of powdery particles and is generally spherical. However, it may take a rod-like shape or other shapes depending on the pulverization method. The size (particle diameter, length, etc) of the resulting powdery particle is generally within the range of about 0.5 to about 25 mm. The powdery particle of the resin composition can be used as such for molding the semiconductor device. If it is advantageous, however, the resin composition may be processed into the tablet as a pre-mold material and is then used for molding the semiconductor device.

To begin with, the raw components are mixed uniformly by mixing means such as a mixer. This mixing step is generally and preferably carried out in accordance with a dry blend process. Next, the resulting raw mixture is molten by a kneading apparatus such as a roll, an extruder or a kneader, and is kneaded. The possibility of contamination of the magnetic metal foreign matter as the problem of the present invention is very likely to occur in this stage of melt-kneading, because the raw material mixture contains a relatively hard inorganic filler. This inorganic filler wears out the inner wall of the kneader during kneading, and worn pieces mix into the raw material mixture. After melt-kneading is completed, the resulting kneaded matter is cooled to, or near, the room temperature and is then pulverized. A roll or a mill can be used as the pulverizing means. There is the possibility that the structural material of the pulverizing means is worn out and contaminates the resin composition. In this way, the powdery particles of the encapsulating resin composition having a desired size can be obtained.

After the powdery particles of the encapsulating resin composition are prepared through a series of the unit operations described above, the present invention carries out the operations for selectively recovering and removing the magnetic foreign metal from the powdery particles. This removing step of the magnetic foreign metal can be carried out preferably using a drum type metal classification-recovering apparatus having a construction peculiar to the present invention as will be explained next.

Figure 6:
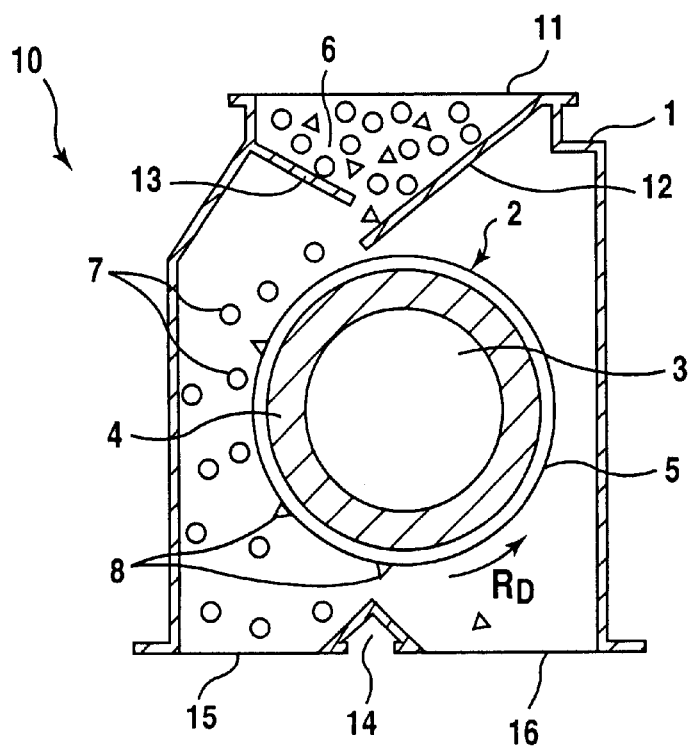
FIG. 6 is a sectional view showing the outline of a drum type metal classification-recovering apparatus according to the present invention.

FIG. 6 is a sectional view showing a preferred example of the drum type metal classification-recovering apparatus that can be used advantageously in the embodiment of the present invention. The drum type metal classification-recovering apparatus 10 has a housing 1. A cylindrical magnetic drum 2 is turnably fitted into the housing 1. The magnetic drum 2 comprises a cylindrical center drum 3 and a cylindrical magnetic member 4 fixed to the outer peripheral surface of the center drum 3. A permanent magnet 5 is shown disposed schematically on the surface of the cylindrical magnetic member 4 in FIG. 6 to have the description more easily understood. The cylindrical center drum 3 is fixed to the shaft of the apparatus 10 through an arm, not shown in the drawing, and can rotate in the direction represented by an arrow RD.

Supply of the powdery particles 6 of the molding resin composition as the material to be processed in the drum type metal classification-recovering apparatus 10 is carried out through raw material feeding means that is wide open at the upper part of the apparatus 10. The raw material feeding means comprises a hopper 11 for receiving the powdery particles 6, a guide plate 12 for guiding down the powdery particles 6 and a damper 13 for continuously supplying an amount of the powdery particles 6 suitable for processing towards the magnetic drum 2. Speaking more correctly, the powdery particles 6 of the encapsulating resin composition as the processed material include the powdery particles of the molding resin composition, that are to be used for the production of the semiconductor device, and the magnetic foreign metal (the magnetic metal powder coated with the resin, the ultra-fine magnetic metal powder, the metal powder having low magnetism, etc, as explained above) that are contained as impurities in the powdery particles.

When the drum type metal classification-recovering apparatus 10 is operated, the powdery particles 6 charged into the hopper are subjected to the metal classification-recovering operation by the magnetic drum 2. The magnetic foreign metal 8 mixing in the powdery particles 6 is magnetic substances and thus is affected by the magnetic force generated from the magnetic drum 2. Therefore, after being attracted to the magnetic drum 2, the magnetic foreign metal 8 is discharged from the discharge port 16, for the foreign metal, disposed at the bottom of the housing 1. The powdery particles 7 of the encapsulating resin composition not containing the magnetic foreign metal is a non-magnetic substance and is not affected by the magnetic force generated from the magnetic drum 2. Therefore, the powdery particles 7 freely fall due to their own weight and are discharged and recovered through the partition member 14 from the powdery particle discharge port 15 spaced apart from the discharge port 16 for the magnetic metal foreign matters.

Figure 7:
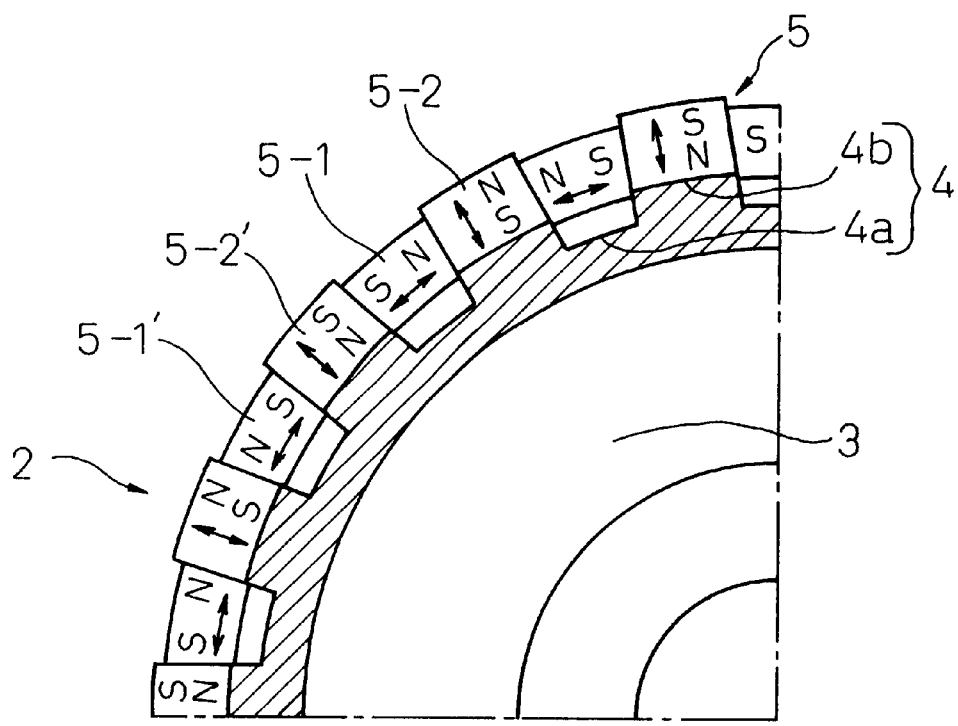
FIG. 7 is a sectional view explaining the construction of the magnetic drum portion of the metal classification-recovering apparatus shown in FIG. 6.

FIG. 7 is a sectional view illustrating the construction of the magnetic drum 2 of the drum type metal classification-recovering apparatus 10 shown in FIG. 6. The magnetic member 4 formed into the cylindrical shape has a tooth-shaped section round its outer periphery. In other words, the recesses 4a and the projections 4b are formed alternately in the circumferential direction on the outer peripheral surface of the magnetic member 4. First magnets 5-1 and 5-1' having a direction of magnetization that is substantially the same as the tangential direction of the magnetic drum 2 (that is, magnetized in the width-wise direction of the magnet) are fitted into the recesses 4a of the magnetic member 4. Second magnets 5-2 and 5-2' having a direction of magnetization that is substantially the same as the direction of the normal of the magnetic drum 2 (that is, magnetized in the thickness-wise direction of the magnet) are fixed to the projections 4b.

In the first magnets 5-1 and 5-1' adjacent to each other, magnetic poles having the same polarity are so arranged as to oppose each other. In other words, one 5-1 of the first magnets has the N pole on the side of the second magnet 5-2 and the other 5-1' of the first magnets, too, has the N pole on the side of the second magnet 5-2.

The second magnets 5-2 and 5-2' are arranged in such a fashion that their magnetic poles on the outer peripheral side have the same polarity as the magnetic poles of the contact surface of the first magnets adjacent to them. In other words, since the magnetic poles of the contact surfaces of the adjacent first magnets 5-1 and 5-1' are the S poles, the magnetic pole of the second magnet 5-2' on the outer peripheral side is the S pole.

The drum type metal classification-recovering apparatus 10 shown in the drawing includes the magnetic drum 2 having the construction shown in FIG. 7. Therefore, the second magnets 5-2 and 5-2' can constitute the magnetic circuit by the projections of the magnetic member 4. (In other words, the line of magnetic flux can pass through the projections of the magnetic member 4.) As a result, the effective length of the magnetic path can be elongated, and the working point of the magnet becomes higher, too. In the case of the construction shown in the drawing, the force of repulsion operates, too, between the second magnets 5-2, 5-2' and the first magnets 5-1, 5-1'. Consequently, a high magnetic force can be obtained due also to the improvement of the magnet working point.

Figure 4:
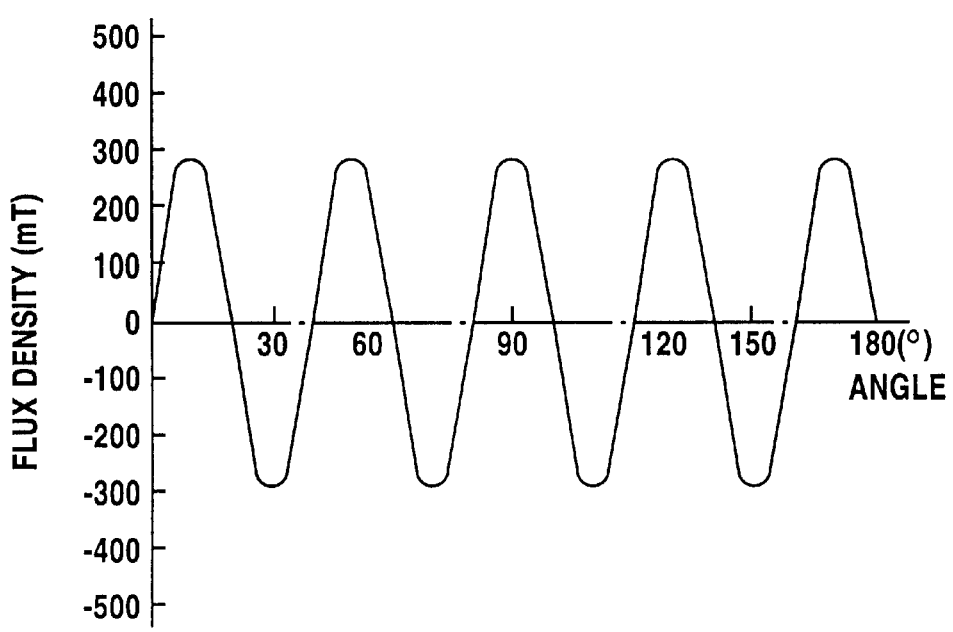
FIG. 4 is a flux density distribution diagram in a circumferential direction on the outer peripheral surface of the non-magnetic drum in the metal classification-recovering apparatus shown in FIGS. 1 and 2.
Figure 5:
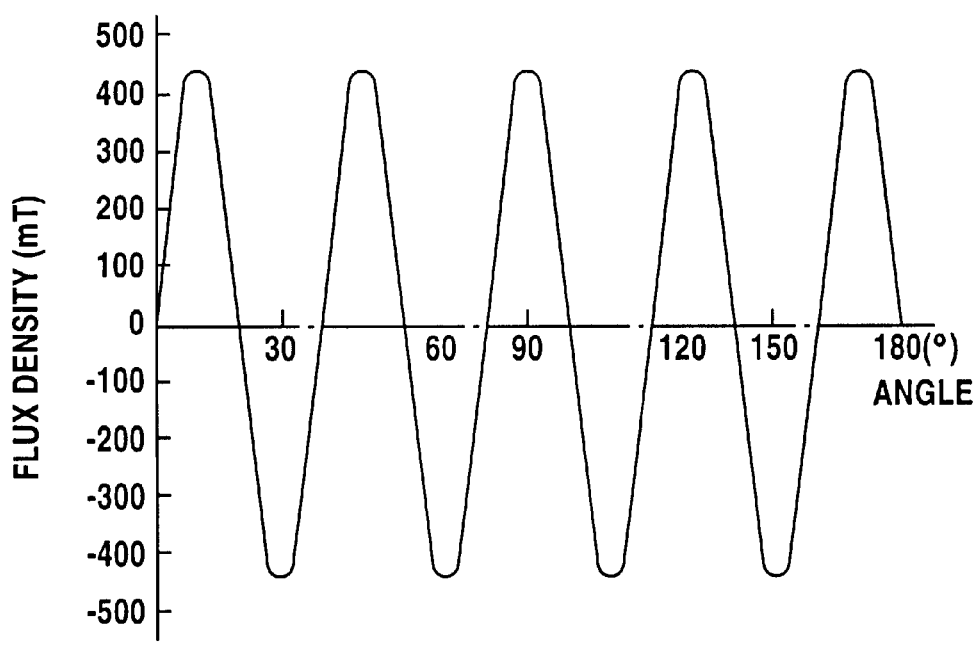
FIG. 5 is a flux density distribution in the circumferential direction on the outer peripheral surface of the non-magnetic drum shown in FIG. 3.
Figure 8:
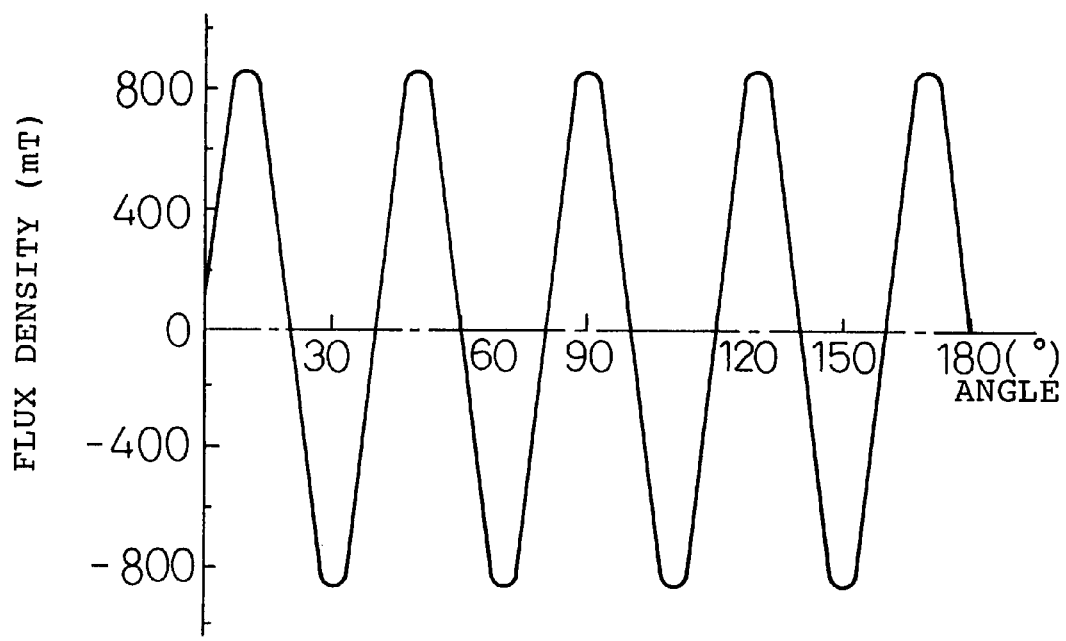
FIG. 8 is a flux density distribution diagram in the circumferential direction on the outer peripheral surface of the magnetic drum of the metal classification-recovering apparatus shown in FIGS. 6 and 7.

FIG. 8 is a graph showing the flux density distribution in the circumferential direction on the outer peripheral surface of the magnetic drum 2 shown in FIG. 7. In comparing this graph with the graph of the prior art example, that is, the flux density distribution diagram of FIGS. 4 and 5 explained in the column of "Background Art" it can be seen that the flux density of the example of the present invention is 832 mT whereas the flux densities of the prior art examples are 285 mT and 433 mT. It can be seen that the present invention can provide a magnetic force that is about 1.6 to about 1.9 times higher than that of the prior art examples.

Figure 9:
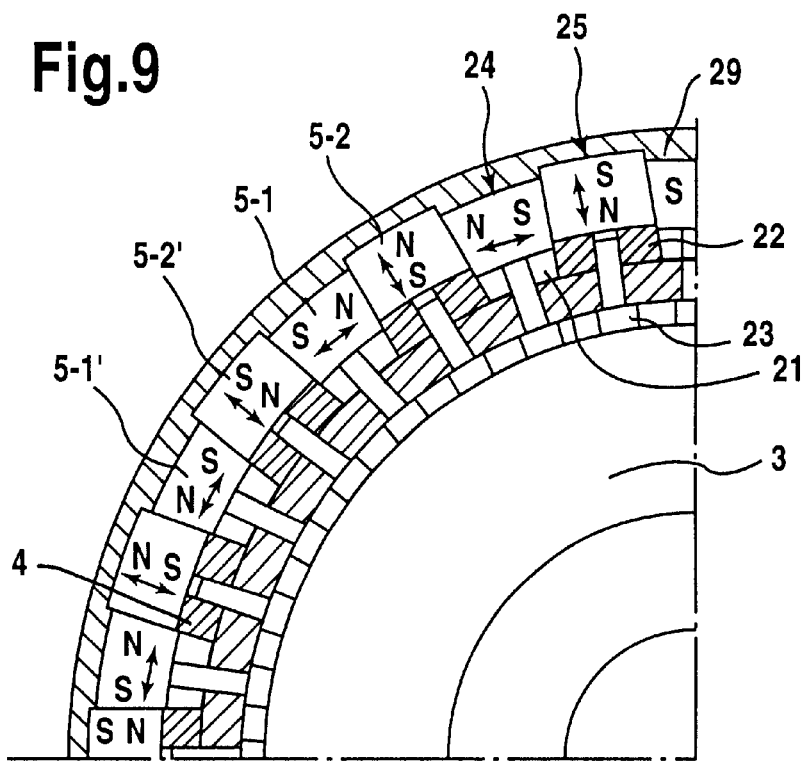
FIG. 9 is a sectional view explaining another example of the drum type metal classification-recovering apparatus according to the present invention with reference to the magnetic drum portion thereof.

FIG. 9 is a sectional view useful for explaining another preferred construction of the magnetic drum of the drum type metal classification-recovering apparatus used in the present invention. The drum 2 shown in this drawing comprises magnet units 24 each including first magnets 5-1 and 5-1' fixed by an adhesive onto a non-magnetic plate 21, and magnet units 25 each including second magnet 5-2 and 5-2' fixed by the adhesive to a magnetic plate 22. The magnet units 24 and 25 are alternately disposed in the circumferential direction of the magnetic drum 2, and are fixed to the magnetic member 4 by bolts 23. The magnetic drum 2 uses fixation by the adhesive and fixation by the mechanical fastening means. Therefore, even though the force of repulsion of the magnetic force exists, the members can be fixed compulsively, the assembling factor can be improved, and the cost of production can be lowered due to shortening of the assembling time.

An outer cladding member 29 made of a yoke material is caulked to the surface of the magnetic drum in the illustrated example. To cover the surface of the magnet with such a yoke material is effective not only in this example but also in the example (not shown) with reference tin FIG. 7 and in general examples of the present invention to protect the magnet and to improve the cleaning property (due to smoothing of the surface).

In the above and other drum type metal classification-recovering apparatuses used in the present invention, the number of revolutions per min. of the magnetic drum can be varied over a broad range. The smaller the number of revolutions, the higher becomes the processing capacity, that is, the removing effect of the magnetic metal foreign matters. The number of revolutions of the magnetic drum may be changed to a desired processing capacity. For this purpose, it is recommended to control non-stepwise the number of revolutions of the drum by using a variable speed motor, or the like. When the charging rate of the powdery particles containing the magnetic foreign metal in mixture as the processed material is limited to a rate as low as possible, the foreign metal, particularly the foreign metal having low magnetism, can be classified and removed more effectively. When the powdery particles containing the magnetic foreign metal are charged, it is effective for the classification to use auxiliary feeding means such as a feeder and to always charge the powdery particles at a constant speed.

Figure 10:
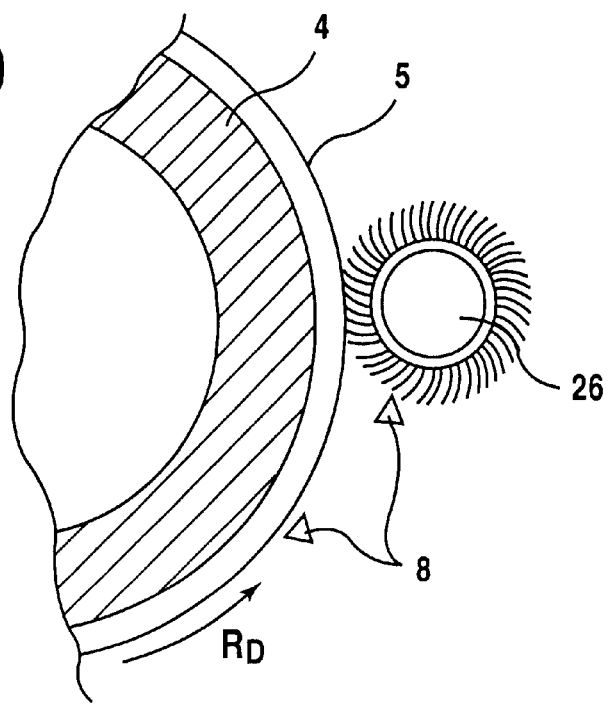
FIG. 10 is a sectional view explaining an example of the use of a foreign metal scraping brush in the drum type metal classification-recovering apparatus according to the present invention.
Figure 11:
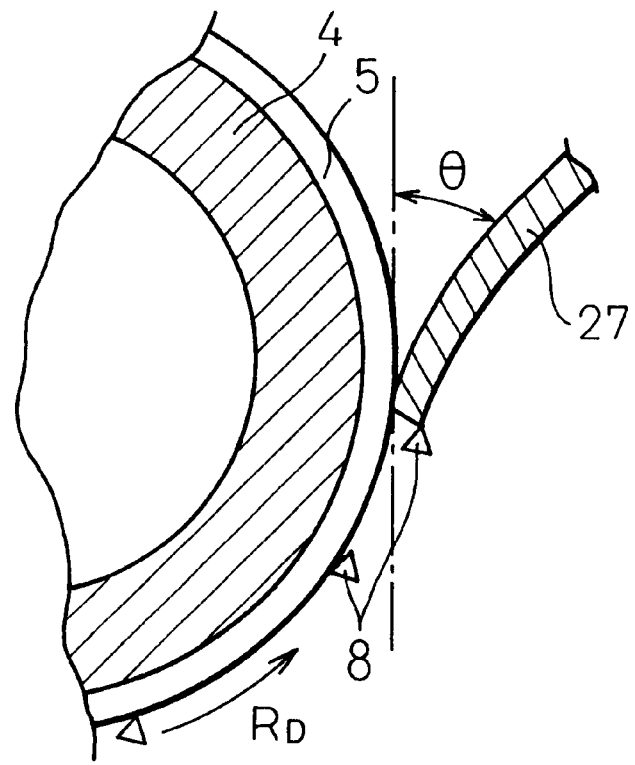
FIG. 11 is a sectional view showing an example of the use of a foreign metal scraping blade in the drum type metal classification-recovering apparatus according to the present invention.

In the practice of the present invention, a cleaning device is preferably used in combination to scrape off the magnetic foreign metal that is kept attracted by the magnetic force to the surface of the magnetic drum of the drum type metal classification-recovering apparatus. Though the details of the construction of this cleaning device is not limited, a scraping member such as a brush or a blade is preferably disposed above the discharge port for the foreign metal in the metal classification-recovering apparatus in such a fashion that the distal end of the member comes into contact with the surface of the magnetic drum. FIG. 10 shows an example where a fur brush 26 is fitted as the cleaning device. In this fur brush 26, short fibers are densely implanted around the roller as shown in the drawing. This fur brush 26 can mechanically remove the fine magnetic foreign metal 8 kept attracted to the surface of the magnetic drum 4. FIG. 11 shows another example where a steel blade 27 is fitted as the cleaning device. As the distal end of the blade 27 comes into contact with the surface of the magnetic drum 4, the fine magnetic foreign metal 8 kept attracted to the surface of the magnetic drum 4 can be scraped off and removed. Incidentally, the distal end of the blade 27 is curved to improve the foreign metal scraping effect. The angle (θ in the drawing) of the blade 27 can be changed arbitrarily in accordance with the desired foreign metal scraping effect, but is preferably within the range of about 0 to 90°. A web made of an attracting fiber material may be used as the cleaning device in place of the brush or the blade, though the web is not shown in the drawing.

When the cleaning device is used in combination, the foreign metal having low magnetism, such as the metal power covered at least partially with the resin and the ultra-fine metal powder (generally having a size of not greater than 0.1 mm), that have not easily been caused to fall to the discharge side of the magnetic foreign metal by the normal operation, can be effectively scraped off and removed from the surface of the magnetic drum. If the fine foreign metal remains on the surface of the magnetic drum, the cleaning operation may be carried out manually by, for example, using an adhesive tape.

The semiconductor encapsulation resin composition obtained after being passed through the drum type metal classification-recovering apparatus desirably does not contain magnetic foreign metal having a size of not less than 35 $\mu$m, more desirably, magnetic foreign metal having a size of not less than 20 $\mu$m, most desirably magnetic foreign metal having a size of not less than 10 $\mu$m. Because the present invention limits the magnetic foreign metal contained in the encapsulating resin composition to the ultra-fine foreign matters having a size of less than 10 $\mu$m, the present invention can prevent beforehand the occurrence of the short-circuit between the wirings of the circuit. For, even if such magnetic foreign metal touches the wires of the semiconductor device such a CSP, the magnetic foreign metal is smaller than the wiring gap. Even if the magnetic foreign metal having the size of greater than 10 $\mu$m but less than 35 $\mu$m, the encapsulating resin composition can be used without any problem in the semiconductor devices such as QFP. This means that when the semiconductor encapsulation resin composition according to the present invention is applied to the production of the semiconductor devices, the present invention can provide semiconductor devices having excellent reliability.

The semiconductor encapsulation resin composition according to the present invention can be used in the form of the tablet, whenever necessary, as explained already. In such a case, the powdery particles of the resin composition are shaped into the tablet having a desired shape and a desired size by a tablet-making machine. There is the possibility that the magnetic foreign metal originating from the tablet-making machine adhere to the surface of the resulting tablets. However, such foreign metal can be generally removed in a simple way by an air blow, or like means. Therefore, incorporation of the foreign metal into the resin composition can be prevented when the appearance of the tablets is checked merely by eye.

The observation acquired by the present inventors has revealed that when the content of free metal powder contained in the encapsulating resin composition is limited to 100 ppm or less, the occurrence the short-circuit between the wirings can be restricted more effectively. In the resin-sealed semiconductor device according to the present invention, the total content of the foreign metal in the semiconductor encapsulation resin composition is preferably 100 ppm or less, more preferably not greater than 30 ppm and most preferably, not greater than 15 ppm, exclusive of the metallic components in the inorganic filler.

The semiconductor encapsulation resin composition according to the present invention preferably has a bending elastic modulus, after curing, of at least 6 GPa and not greater than 19 GPa at 25° C., and a coefficient of linear expansion of $6 \times 10^{-6}$ to $60 \times 10^{-6}$/K at a temperature within the range of 25° C. to a glass transmission temperature. When the resin composition satisfies the properties within these ranges, adhesion becomes excellent, the internal stress of the semiconductor device is small, and a semiconductor device having high reliability can be acquired. When the coefficient of linear expansion in the vitreous region is greater than $60 \times 10^{-6}$/K, the internal stress of the semiconductor device is so great that the semiconductor device may be broken. When the coefficient of linear expansion is smaller than $6 \times 10^{-6}$/K, peeling is likely to develop because the stress occurring at the interface between the resin and the bumps is great, inviting possible breakdown of the semiconductor device. When the bending elastic modulus is greater than 19 GPa, the molding resin cannot easily mitigate the internal stress of the semiconductor device and adhesion between the molding resin and the semiconductor device drops. In consequence, reliability of the resulting semiconductor device drops. If the internal stress develops in the semiconductor device, the outer shape of the semiconductor device undergoes deformation with the result that a projecting warp occurs on the surface to which the semiconductor device is mounted. It can be said that the greater this warping distance, the greater the internal stress of the semiconductor device.

Furthermore, the semiconductor encapsulation resin composition according to the present invention preferably has a melt viscosity of not greater than 200 poises and a gelling time of at least 45 seconds. Here, when the melt viscosity of the encapsulation resin composition is greater than 200 poises, the non-packaged portions are likely to occur when the wafer is sealed. When the gelling time is less than 45 seconds, the non-packaged portions are also likely to occur during encapsulation. Incidentally, when the gelling time exceeds 120 seconds, shaping becomes more difficult and productivity drops. The non-packaged portions exert the adverse influences on reliability of the semiconductor device as already described.

The resin-sealed type semiconductor device of the present invention can be produced by various means by using the encapsulating resin composition of this invention after the magnetic foreign metal is completed removed.

In one preferred aspect of the present invention, a preparatory device of an non-molded semiconductor device (such as a semiconductor wafer) is first prepared, and the encapsulating resin composition is introduced at 120 to 250° C., preferably 150 to 200° C., from the resin charging port to the preparatory device of the semiconductor device by methods such as compression molding, transfer molding, injection molding or pouring. Additional heat-treatment (at 150 to 180° C. for 2 to 16 hours, for example), may be carried out, whenever necessary.

Figure 12:
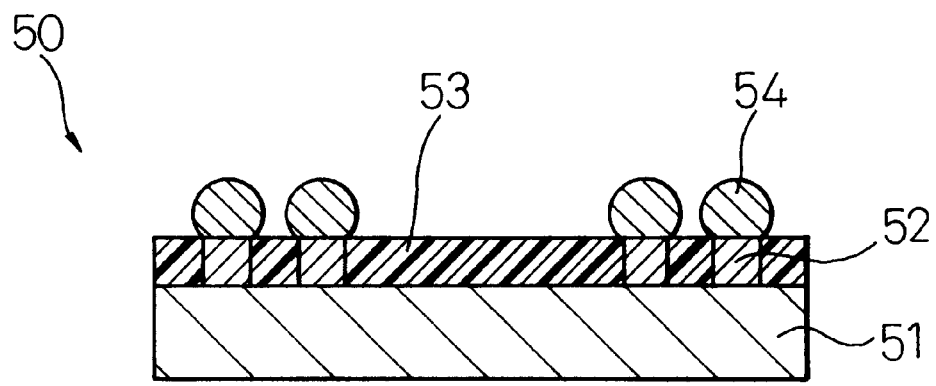
FIG. 12 is a sectional view showing an example of a resin-sealed type semiconductor device according to the present invention.

FIG. 12 is a sectional view showing a chip sized package (CSP) as a preferred example of the resin-sealed semiconductor device according to the present invention. The chip sized package 50 shown in the drawing can be fabricated by forming Cu bumps 52 for external terminals by plating on a silicon wafer 51, applying the molding resin composition 53 of the present invention to the gaps between the Cu bumps 52 on the silicon wafer, and conducting resin encapsulation. After this resin encapsulation, solder balls 54 are formed on the Cu bumps 52 and in the final dicing step, discrete devices are diced. In the chip sized package 50 so obtained, the thickness of the resin encapsulation layer is 80 to 120 $\mu$m, but it does not contain even slight voids or magnetic foreign metal.

In the CPS described above and in other resin-sealed semiconductor devices, the present invention can prevent or restrict breakage of the wires resulting from the existence of the magnetic foreign metal, the occurrence of voids and cracks after encapsulation, the resin cracking that may occur at the time of packaging of moisture absorbing packages, the drop of the insulation resistance of the resin layer due to absorption of moisture after packaging, the drop of the mechanical strength of the resin layer, and the drop of the bonding strength with the silicon device. The present invention can also prevent the occurrence of the peeling due to the impact at the time of dicing of the wafer into the discrete devices and can insure high reliability.

EXAMPLES

Next, the present invention will be explained with reference to examples thereof.

Example 1

| Preparation of semiconductor encapsulation resin composition | |
|---|---|
| biphenyl type epoxy resin: | 100 parts by weight (pbw) |
| (YX-4000H, product of Yuka Shell Kagaku K. K.) p-xylylenephenol, as curing agent: | 94.1 pbw |
| (XLC-225LL, product of Mitsui-Toatsu Kagaku K.K.) flexibility-imparting agent | 5 pbw |
| (Clayton G-1901X, Shell Kagaku K. K.) molten silica* (as inorganic filler) | 50 pbw |
| (FB-6S, Denki Kagaku Kogyo K. K.) triphenylphosphine, as curing agent | 1.6 pbw |

[molten silica*: molten silica surface-treated by γ-glycidoxypropyl trimethoxysilane that was in advance subjected to hydrolytic treatment; coupling agent:pure water = 95:5; filler:hydrolyzed coupling agent = 100:1]

These starting components were mixed in a mixer, then melt-kneaded and further cooled and pulverized, giving a semiconductor encapsulation epoxy resin composition.

Removal of Magnetic Foreign Metal

Figure 2:
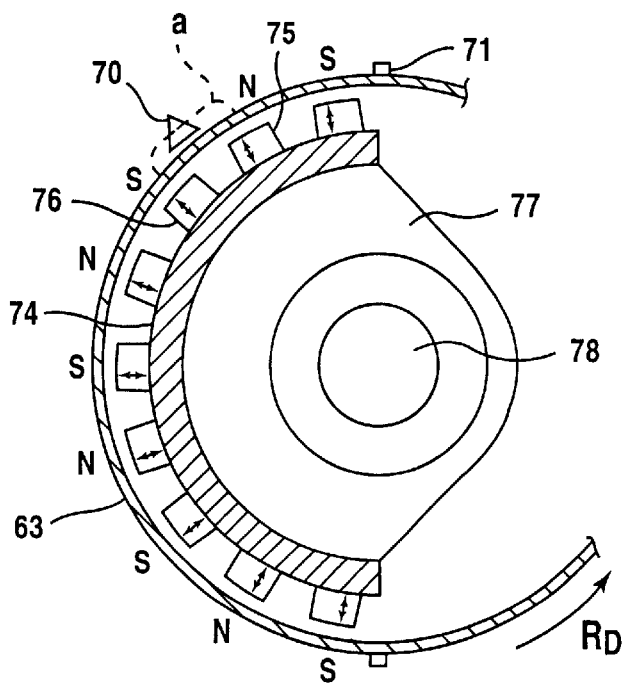
FIG. 2 is a sectional view explaining the construction of a non-magnetic drum portion of the metal classification-recovering apparatus shown in FIG. 1.
Figure 3:
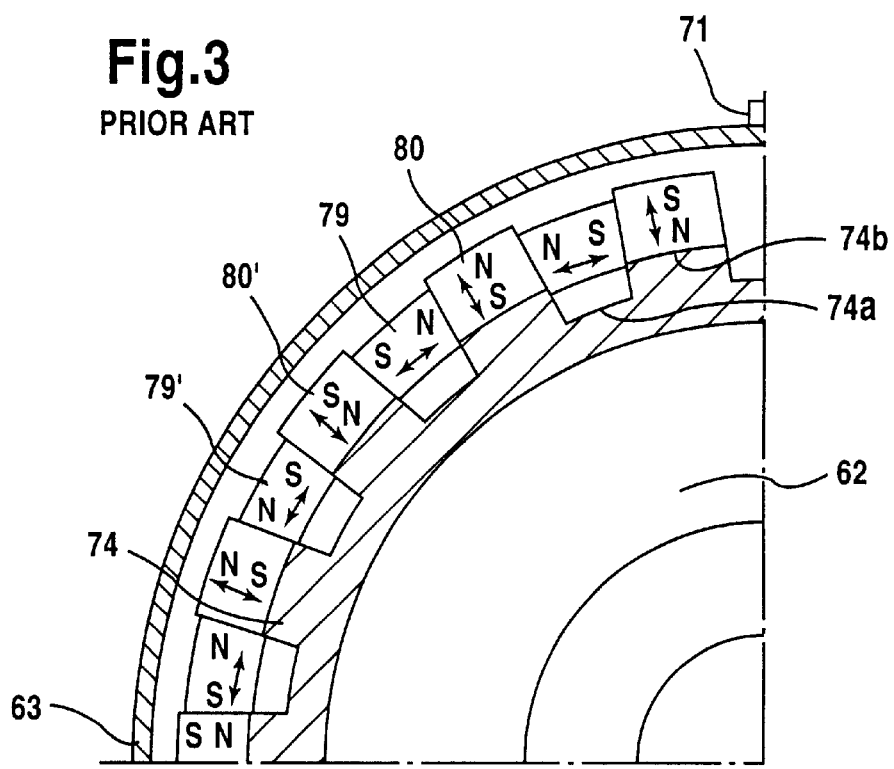
FIG. 3 is a sectional view explaining another example of a drum type metal classification-recovering apparatus with reference to the construction of a non-magnetic drum portion thereof.

To remove the magnetic foreign metal, expected to contaminate the resulting epoxy resin composition, therefrom, a foreign metal removing step was carried out by using a drum type metal classification-recovering apparatus. This example used the metal classification-recovering apparatus explained with reference to FIG. 9 (Example of this invention) and the metal classification-recovering apparatus explained with reference to FIG. 2 (Comparative Example) for comparison.

In the metal classification-recovering apparatus used in this example, the materials, etc, of the constituent members were listed below.

Size of casing (case): height 750 mm×width 475 mm (in shaft direction)×length 380 mm Material of casing: SS400 Stainless Steel Size of non-magnetic drum: outer diameter 300 mm×length 300 mm Material of non-magnetic drum: SUS304 Stainless Steel Revolutions of magnetic drum: 37 rpm (50 Hz)

Poles of magnetic drum: 9 poles

Material of magnet: Nd-Fe-B-based rare earth magnet (HS-40AH, produced by Hitachi Metal Co., Ltd.)

The epoxy resin composition was supplied from the hopper at the upper end of the apparatus, and the residual amount (ppm) of the magnetic foreign metal in the powdery particles of the epoxy resin composition recovered and the maximum length (μm) of the metal foreign matters were measured. The result is tabulated in Table 1 given below.

Production of Resin Encapsulation Semiconductor Device

The chip sized package shown in FIG. 12 was produced by the means described above (compression molding method) using the epoxy resin composition after having the metal classification-recovering treatment, and the resulting CSP was tested for the following test items.

(1) Moisture resistance:

The CSP was left standing in a pressure cooker tester (121° C., 85% RH: Relative Humidity) for 1,000 hours, and a device defect was checked when a 7 V bias voltage was applied. Table 1 below illustrates the number of device defects per 20 devices (total number of devices).

(2) Crack resistance when packaging:

The CSP was allowed to absorb moisture at 85° C. and 85% RH for 96 hours. The existence of any cracks in the resin layer after substrate packaging (IR reflow, maximum temperature: 245° C.) was observed through a stereomicroscope. Table 1 illustrates the level of the crack resistance.

(3) Void formability:

Whether or not voids existed in the resin layer of the semiconductor device was confirmed through a ultrasonic flaw detection microscope. Table 1 illustrates the existence/absence of the voids.

(4) Silicon device/resin bondability (peel after heat impact test):

The CPS was subjected to a cooling/heating heat impact test between −65° C. to 150° C., and whether or not peel occurred was confirmed. Table 1 illustrates the number of devices in which peel occurred for 20 devices (total number of devices).

Examples 2 to 4

The procedures of Example 1 were repeated in the same way with the exception that the blend amount of the inorganic filler was changed as tabulated in Table 1. Table 1 illustrates the results.

TABLE 1

| Test Items | Ex. 1 | Ex. 2 | Ex. 3 | Ex. 4 | Comp. Ex. |
|---|---|---|---|---|---|
| amount of filler (wt %) | 50 | 70 | 80 | 90 | 50 |
| residual amount of foreign metal (ppm) | 15 | 10 | 12 | 12 | 500 |
| maximum length of foreign metal (μm) | 8 | 8 | 8 | 8 | 53 |
| moisture resistance (PCT 1000 h) | 0/20 | 0/20 | 0/20 | 0/20 | 20/20 |
| crack resistance in packaging | good | good | good | good | good |
| void formability | none | none | none | none | none |
| peeling after heat impact test | 0/20 | 0/20 | 0/20 | 0/20 | 0/20 |

In the Comparative Example, the foreign metal (Φ 53 μm) overlapped with one another, so that they exceeded the thickness (100 μm) of the resin layer during encapsulation, and the force that pushed the wafer broke the wafer itself.

It can be understood from the result tabulated in Table 1 that the present invention can provide an excellent result in both residual amount (ppm) of the magnetic foreign metal in the powdery particles and in their maximum length (μm) because the magnetic foreign metal was removed by using the metal classification-recovering apparatus having the specific construction. The present invention can also improve drastically the device defect ratio. For example, when the result of Example 1 of this invention was compared with the result of Comparative Example as the example of the prior art, Example 1 could reduce the residual amount of the foreign metal from 500 ppm of Comparative Example to 15 ppm, and could reduce also the maximum length of 53 $\mu$m of Comparative Example to 8 $\mu$m. As to the device defect ratio, too, the present invention could improve the defect ratio to 0/20 of the defect ratio of 20/20 of Comparative Example.

INDUSTRIAL APPLICABILITY

According to the present invention, the metal classification-recovering step that is carried out in the final stage of the production process can completely remove the magnetic foreign metal the removal of which has been difficult by the conventional technologies. Therefore, the present invention can provide a semiconductor encapsulation resin composition that can make great contributions to the improvement in performance of semiconductor devices and their reliability. It is particularly noteworthy that the present invention can classify and recover accurately and reliably ultra-small magnetic foreign metal and foreign metal having low magnetism contained as contaminants in the resin composition. When the semiconductor encapsulation resin composition according to the present invention is used, a resin-sealed semiconductor device having excellent reliability can be provided. Particularly in the semiconductor devices of the type in which the semiconductor substrate equipped with the bumps for the external terminals are resin-sealed by the resin composition in such a manner that the end face of each bump is exposed, and then the discrete devices are diced, the present invention can provide the semiconductor devices having high reliability by using the encapsulating resin composition of the present invention.

What is claimed is:

1. A resin composition for semiconductor encapsulation comprising an epoxy resin, a curing agent and an inorganic filler;

wherein said resin composition is powdery particles produced by a series of unit operations including melt-kneading and pulverization of a starting raw material mixture; and wherein foreign metal having magnetic property originating from metallic materials constituting production apparatuses used during said unit operations and mixed into said powdery particles is selectively recovered and removed by a drum type metal classification-recovering apparatus.

2. A resin composition according to claim 1, wherein said foreign metal includes magnetic metal covered at least partially with a resin, magnetic metals having sizes of less than 35 $\mu$m and metal having low magnetism.

3. A resin composition according to claim 1, wherein said drum type metal classification-recovering apparatus includes raw material feeding means and a magnetic drum comprising a cylindrical drum capable of rotating by itself and a cylindrical magnetic member having a plurality of permanent magnets disposed and fixed to the outer peripheral surface of said drum, a discharge port for said foreign metal and a powdery particle discharge port;

wherein said magnetic drum includes a magnetic member having a gear-shaped sectional shape having recesses and projections formed alternately at the outer peripheral portion thereof, first magnets disposed in said outer peripheral recesses of said magnetic member and having a direction of magnetization substantially the same as a tangential direction of said magnetic drum, and second magnets disposed at said outer peripheral projections of said magnetic member and having a direction of magnetization substantially the same as a normal direction of said magnetic drum;

wherein said first magnets are disposed in such a fashion that the magnetic poles thereof having the same polarity oppose one another; and wherein said second magnets are disposed in such a fashion that the magnetic poles on the outer peripheral side of said magnetic drum have the same polarity as the magnetic poles on the contact surface of said first magnets adjacent thereto.

4. A method of producing a semiconductor encapsulating resin composition comprising an epoxy resin, a curing agent and an inorganic filler, comprising the steps of:

processing a raw material mixture of said resin composition into powdery particles through a series of unit operations including melting-kneading and pulverization of said raw material mixture; and charging the resulting powdery particles into a drum type metal classification-recovering apparatus, and selectively recovering and removing foreign metal having magnetic property originating from metallic materials constituting a production apparatus used and mixed into said powdery particles.

5. A method of producing a semiconductor encapsulating resin composition according to claim 4, wherein said drum type metal classification-recovering apparatus includes raw material feeding means, a magnetic drum comprising a cylindrical drum capable of rotating by itself and a cylindrical magnetic member having a plurality of permanent magnets disposed and fixed to the outer peripheral surface of said drum, a discharge port for magnetic metal foreign matters, and a powdery particle discharge port;

wherein said magnetic drum includes a magnetic member having a gear-shaped sectional shape having recesses and projections formed alternately at the outer peripheral portion thereof, first magnets disposed in said outer peripheral recesses of said magnetic member and having a direction of magnetization substantially the same as a tangential direction of said magnetic drum, and second magnets disposed at said outer peripheral projections of said magnetic member and having a direction of magnetization substantially the same as a normal direction of said magnetic drum;

wherein said first magnets are disposed in such a fashion that the magnetic poles thereof having the same polarity oppose one another; and wherein said second magnets are disposed in such a fashion that the magnetic poles on the outer peripheral side of said magnetic drum have the same polarity as the magnetic poles on the contact surface of said first magnets adjacent thereto.

6. An apparatus for producing a semiconductor encapsulating resin composition comprising an epoxy resin, a curing agent and an inorganic filler, said apparatus comprising:

an apparatus for melting and kneading a raw material mixture of said resin composition;

an apparatus for pulverizing the resulting kneaded matter and forming powdery particles of said resin composition; and a drum type metal classification-recovering apparatus for selectively recovering and removing foreign metal having magnetic property originating from metallic materials constituting apparatuses for producing said powdery particles of said resin composition, inclusive of said melt-kneading apparatus and said pulverizing apparatus;

wherein said drum type metal classification-recovering apparatus includes raw material feeding means, a magnetic drum comprising a cylindrical drum capable of rotating by itself and a cylindrical magnetic member having a plurality of permanent magnets disposed and fixed to the outer peripheral surface of said drum, a discharge port for said foreign metal and a powdery particle discharge port;

wherein said magnetic drum includes a magnetic member having a gear-shaped sectional shape having recesses and projections formed alternately at the outer peripheral portion thereof, first magnets disposed in said outer peripheral recesses of said magnetic member and having a direction of magnetization substantially the same as a tangential direction of said magnetic drum, and second magnets disposed at said outer peripheral projections of said magnetic member and having a direction of magnetization substantially the same as a normal direction of said magnetic drum;

wherein said first magnets are disposed in such a fashion that the magnetic poles thereof having the same polarity oppose one another; and wherein said second magnets are disposed in such a fashion that the magnetic poles thereof on the outer peripheral side of said magnetic drum have the same polarity as the magnetic poles on the contact surface of said first magnets adjacent thereto.

7. An apparatus for producing a semiconductor encapsulating resin composition according to claim 6, which further includes magnet units having a non-magnetic plate bonded and fixed to the magnetic pole surface of said first magnets, and magnetic units having a magnetic plate bonded and fixed to the magnetic pole surface of said second magnets on the inner peripheral side, and wherein both of said magnetic units are fixed alternately and at least mechanically to said magnetic member in the circumferential direction.

8. An apparatus for producing a semiconductor encapsulating resin composition according to claim 7, wherein said magnetic drum is further equipped with means for scraping off the foreign metal adhered to said magnetic drum.

9. A resin-sealed semiconductor device produced by encapsulating a semiconductor substrate having bumps for external terminals with a semiconductor encapsulating resin composition while the end faces of said bumps are exposed, followed by dicing said semiconductor substrate into discrete devices:

wherein said semiconductor encapsulating resin composition is powdery particles comprising an epoxy resin, a curing agent and an inorganic filler and produced through a series of unit operations inclusive of melt-kneading and pulverization of a raw material mixture; and wherein foreign metal having magnetic property originating from metallic materials constituting production apparatuses used through said unit operations and mixed in said powdery particles are selectively recovered and removed by a drum type metal classification-recovering apparatus.

10. A resin-sealed semiconductor device according to claim 9, wherein the total amount of metal components other than the metallic components contained in said inorganic filler is not greater than 100 ppm.

* * * * *